US012610503B2

(12) United States Patent
Dede et al.

(10) Patent No.: US 12,610,503 B2
(45) Date of Patent: Apr. 21, 2026

(54) PUMP ASSISTED CAPILLARY COOLER ASSEMBLIES HAVING FLUID WICKING

(71) Applicant: Toyota Motor Engineering & Manufacturing North America, Inc., Plano, TX (US)

(72) Inventors: Ercan M. Dede, Ann Arbor, MI (US); Danny J. Lohan, Northville, MI (US); Shailesh N. Joshi, Ann Arbor, MI (US)

(73) Assignees: Toyota Motor Engineering & Manufacturing North America, Inc., Plano, TX (US); Toyota Jidosha Kabushiki Kaisha, Toyota (JP)

( * ) Notice: Subject to any disclaimer, the term of this patent is extended or adjusted under 35 U.S.C. 154(b) by 252 days.

(21) Appl. No.: 18/610,828

(22) Filed: Mar. 20, 2024

(65) Prior Publication Data

US 2025/0301601 A1     Sep. 25, 2025

(51) Int. Cl.
*H05K 7/20* (2006.01)

(52) U.S. Cl.
CPC ..... *H05K 7/20327* (2013.01); *H05K 7/20254* (2013.01); *H05K 7/20336* (2013.01)

(58) Field of Classification Search
CPC ........... H05K 7/20327; H05K 7/20254; H05K 7/20336; H05K 7/20936
See application file for complete search history.

(56) References Cited

U.S. PATENT DOCUMENTS

| | | | |
|---|---|---|---|
| 4,470,450 A | 9/1984 | Bizzell et al. | |
| 7,650,931 B2 * | 1/2010 | Siu | F28D 15/0233 |
| | | | 29/890.032 |
| 11,340,023 B1 | 5/2022 | Reid et al. | |
| 2009/0283244 A1 | 11/2009 | Bezama et al. | |
| 2010/0243210 A1 | 9/2010 | Rosenfeld et al. | |
| 2019/0239395 A1 * | 8/2019 | Joshi | F28D 15/046 |
| 2021/0195952 A1 * | 7/2021 | Trieu | A61M 15/06 |
| 2022/0065549 A1 * | 3/2022 | Zhou | F28D 15/0275 |

FOREIGN PATENT DOCUMENTS

| | | |
|---|---|---|
| CN | 107681115 B | 8/2020 |
| CN | 111504103 A | 8/2020 |

\* cited by examiner

*Primary Examiner* — Jacob R Crum
(74) *Attorney, Agent, or Firm* — Dinsmore & Shohl LLP

(57) ABSTRACT

Embodiments herein are directed to a cooler assembly. The cooler assembly includes a cold plate having a first surface and an opposite second surface, a base wick fluidly coupled to the first surface, a heat-generating device, and a fluid wicking structure. The heat-generating device coupled to the second surface of the cold plate. The fluid wicking structure includes a plurality of mesh layers. Each one of the plurality of mesh layers are spaced apart from one another. Each of the plurality of mesh layers have a portion in fluid communication with the base wick. The manifold, the plurality of mesh layers and the base wick are configured to direct a liquid coolant to the first surface of the cold plate in an equidistant wicking delivery path to the cold plate.

20 Claims, 6 Drawing Sheets

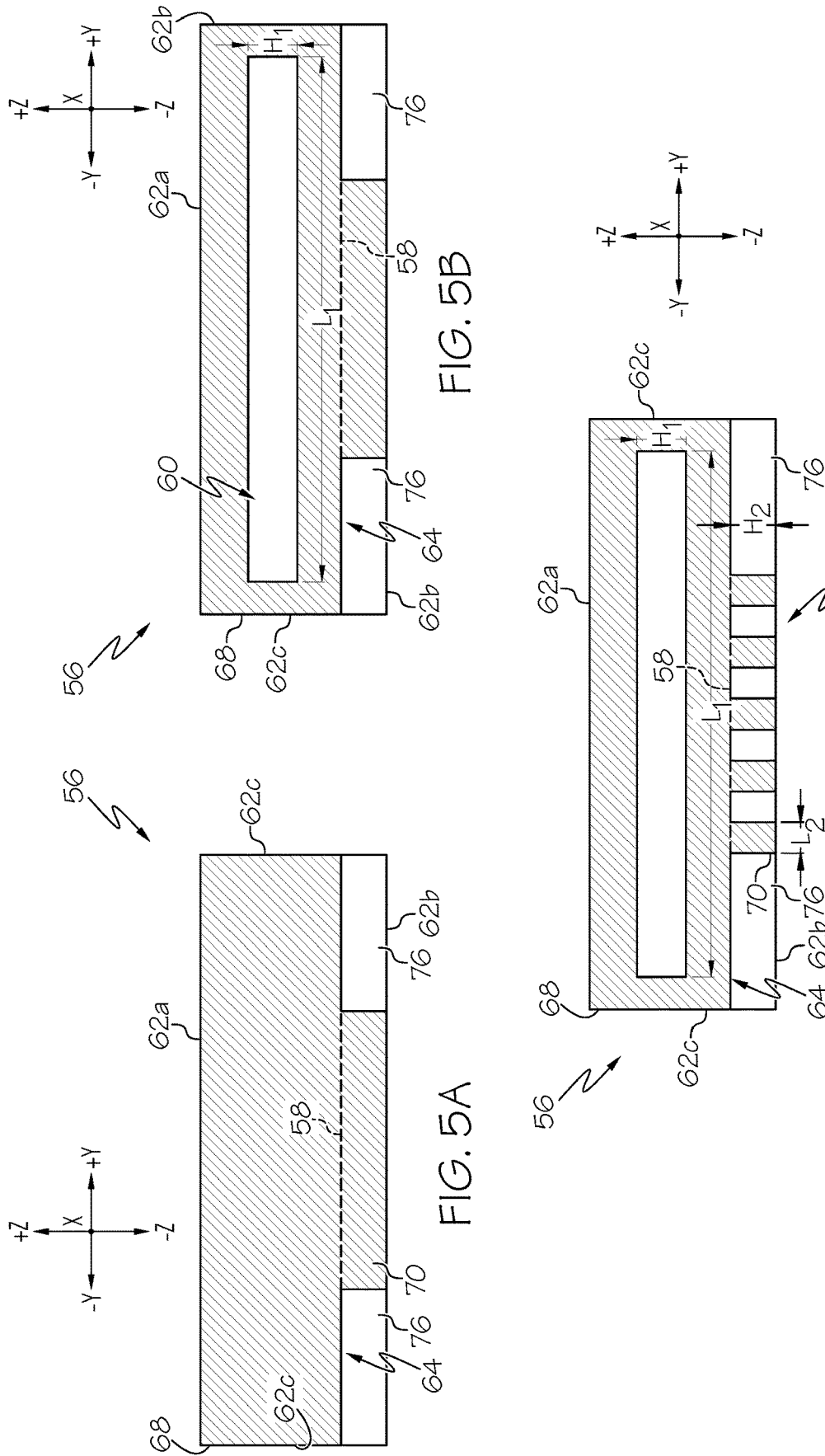

600

FORMING THE COLD PLATE — 605

FORMING THE MANIFOLD WITH WICKING STRUCTURE — 610

ADDING AN OPENING — 615

ADDING A PLURALITY OF ALTERNATING NOTCHES — 620

FORMING THE MANIFOLD COVER — 625

POSITIONING THE MANIFOLD COVER AND THE MANIFOLD WITH THE WICKING STRUCTURE ONTO THE COLD PLATE — 630

PUMP ASSISTED CAPILLARY COOLER ASSEMBLIES HAVING FLUID WICKING

TECHNICAL FIELD

The present specification generally relates to pump assisted capillary cooler assemblies and, more particularly, to high heat flux pump assisted capillary cooler assemblies having a cold plate and fluid wicking structures.

BACKGROUND

Heat management devices may be coupled to a heat generation device, such as a power electronics device or integrated circuit (e.g., central processing unit, CPU, or graphics processing unit, GPU), to remove heat and lower the operating temperature of the heat generating device. A liquid coolant, such as a cooling fluid, may be introduced to the heat management device, where it receives heat from the heat management device, primarily through convective and/ or conductive heat transfer. The fluid may further remove heat through latent heat of vaporization as it changes phase from a liquid to a vapor. The vapor and/or remaining liquid coolant is then removed from the heat management device, thereby removing heat from the heat-generating device. As power electronic or integrated circuit devices are designed to operate at increased power levels, the devices generate an increased corresponding heat flux. The increase in heat flux generated by the power electronics devices may render conventional heat sinks inadequate to reject sufficient heat to maintain a desired operating temperature in the power electronics device. Further, conventional cooling technology presents a tradeoff between cooling capacity and pumping power, which limits the application of certain technologies. For example, conventional systems using pump-assisted capillary cooler configurations are passively cooled, which limits boiling performance.

As power electronics modules or integrated circuit multi-chip modules are incorporated into increasingly compact and variable arrangements, more configurable and scalable cooling assemblies are desired.

SUMMARY

In one aspect, a pump assisted capillary (PAC) cooler assembly is provided. The PAC cooler assembly includes a cold plate having a first surface and an opposite second surface, a base wick fluidly coupled to the first surface, a heat-generating device coupled to the second surface of the cold plate, and a fluid wicking structure. The fluid wicking structure includes a plurality of mesh layers. Each one of the plurality of mesh layers are spaced apart from one another. Each of the plurality of mesh layers have a portion in fluid communication with the base wick. The plurality of mesh layers and the base wick are configured to direct a liquid coolant to the first surface of the cold plate in an equidistant wicking delivery path to the cold plate.

In another aspect, an electronics assembly is provided. The electronics assembly includes a cooler assembly. The cooler assembly includes a cold plate, a base wick, a heat-generating device, and a fluid wicking structure. The cold plate has a first surface and an opposite second surface. The base wick is fluidly coupled to the first surface of the cold plate. The heat-generating device is coupled to the second surface of the cold plate. The fluid wicking structure includes a plurality of mesh layers. Each one of the plurality of mesh layers are spaced apart from one another. Each of the plurality of mesh layers have a portion in fluid communication with the base wick. The plurality of mesh layers further include an upper frame, an opposite lower frame, a pair of side frames extending between the upper frame and the lower frame, and a plurality of mesh pores. The plurality of mesh pores of the plurality of mesh layers and the base wick are configured to direct a liquid coolant to the first surface in an equidistant wicking delivery path to the cold plate. The equidistant wicking delivery path is in a vertical direction between the cold plate and the plurality of mesh layers.

In yet another aspect, a method for forming a pump assisted capillary cooler assembly is provided. The method includes forming a cold plate having a first surface and a second surface and a base wick fluidly coupled to the first surface, forming a fluid wicking structure having a plurality of mesh layers, each of the plurality of mesh layers include a plurality of mesh pores to direct a liquid coolant to the array of fluid channels of the cold plate in an equidistant wicking delivery path, forming a manifold case configured to receive the fluid wicking structure, the manifold case further configured to encapsulate the base wick and the fluid wicking structure, and positioning the manifold case, the fluid wicking structure, and the plurality of mesh layers in communication with the surface of the cold plate such that a portion of each of the plurality of mesh layers are in fluid communication with the base wick of the cold plate.

These and additional objects and advantages provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 5B schematically depicts a front view of a second aspect of a mesh layer of the example PAC cooler assembly of FIG. 1 according to one or more embodiments shown or described herein;

FIG. 5C schematically depicts a front view of a third aspect of a mesh layer of the example PAC cooler assembly of FIG. 1 according to one or more embodiments shown or described herein.

DETAILED DESCRIPTION

Embodiments of the present disclosure are directed to a heat flux pump assisted capillary (PAC) cooler assembly for thermal management of CPU or GPU devices found in data centers, or power electronics devices found in vehicle energy conversion applications. Current trends require removal of heat fluxes up to 1000 W/cm². The PAC cooler assemblies described herein are intended to cool heat fluxes generated by a corresponding electronics device of 1000 W/cm² over a device size of 0.5 cm² to 3 cm².

As described in more detail herein, the cooler assembly includes a cold plate, a fluid wicking structure, and a manifold case, or cover. The manifold case includes a fluid inlet, a fluid outlet, and a plurality of vapor chambers. The cold plate may be a substrate that includes a manifold surface and an opposite device surface. A heat-generating device may be coupled to the device surface of the cold plate. A base wick may be positioned on or formed with the manifold surface adjacent to the heat-generating device. The fluid wicking structure may include a multi-layer construction for the PAC cooler assembly. The multi-layer construction may be a plurality of mesh layers that are spaced apart from one another. Each of the plurality of mesh layers have a portion in fluid communication with the base wick. The manifold, the plurality of mesh layers and the base wick may be configured to direct a liquid coolant to the manifold surface in an equidistant wicking delivery path to the cold plate.

The manifold case of the PAC cooler may be additively manufactured or printed from a polymer around the functionally spaced plurality of mesh layers that extend through, or are received within a receiving cavity of the manifold case and extend down to the manifold surface of the cold plate. The manifold case may be positioned over the cold plate such that a portion of the plurality of mesh layers abut the base wick to create an equidistant wicking length across the manifold mesh everywhere down to the manifold surface in a vertical direction. In some embodiments, the polymer block of the manifold case may be printed around the mesh layers or printed separately for mesh layer insertion after the additive manufacturing of the polymer block.

As such, the embodiments disclosed herein enable low-cost construction of the PAC assembly utilizing a mesh layer-based approach, and is highly scalable since wicking length does not change based on chip size, compared to conventional assemblies.

Figure 1:
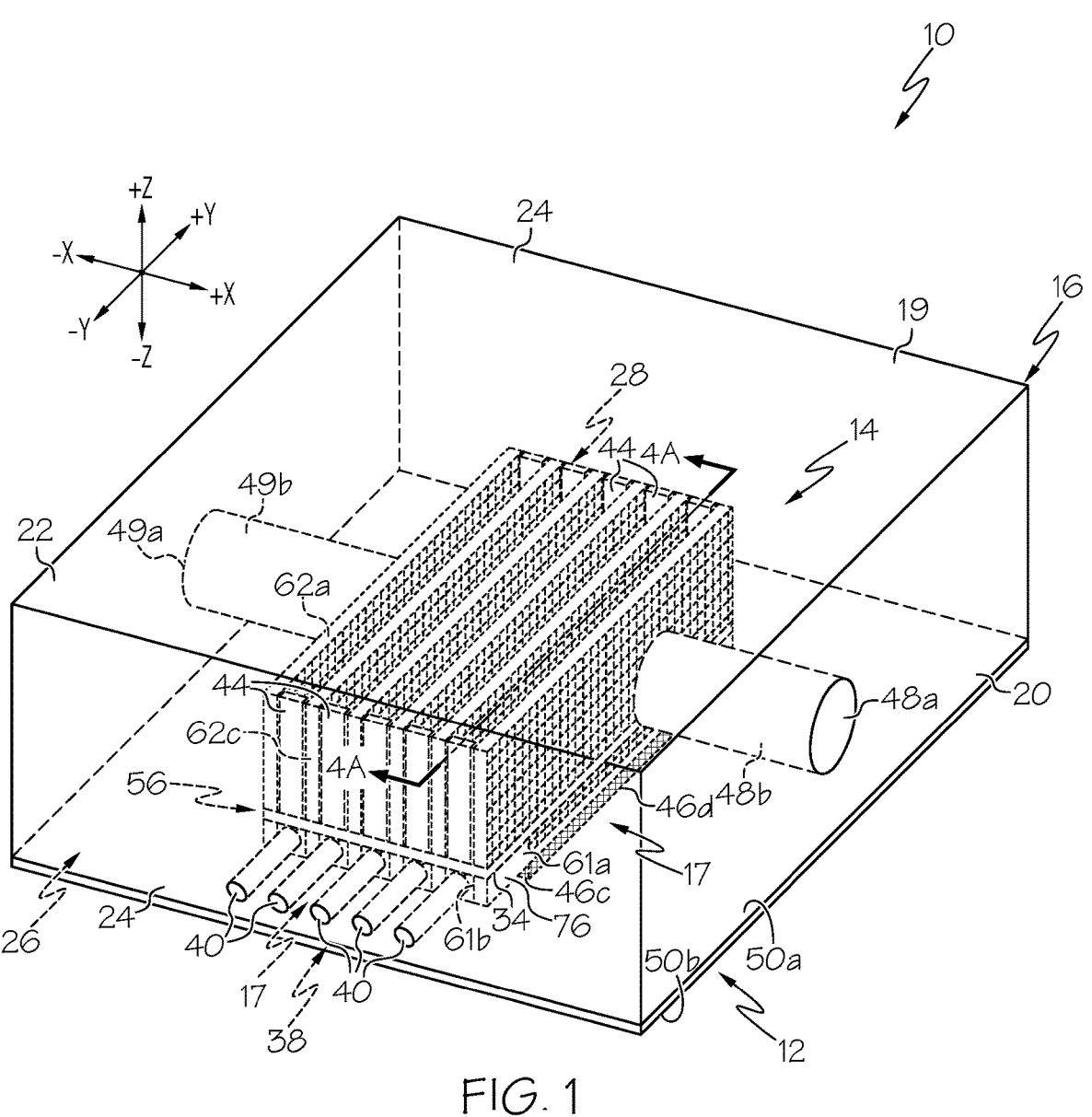
FIG. 1 schematically depicts a perspective view of an example pump assisted capillary (PAC) cooler assembly according to one or more embodiments shown or described herein.

As used herein, the term "longitudinal direction" refers to the forward-rearward direction of the PAC cooler assembly (i.e., in the +/–X-direction depicted in FIG. 1). The term "lateral direction" refers to the cross PAC cooler assembly direction (i.e., in the +/–Y-direction depicted in FIG. 1), and is transverse to the longitudinal direction. The term "vertical direction" or "up" or "above" or "below" refer to the upward-downward direction of the PAC cooler assembly (i.e., in the +/–Z-direction depicted in FIG. 1).

Turning now to the figures, FIGS. 1-3 and 4A-4B depict various schematic depictions of an example PAC cooler assembly 10. The example PAC cooler assembly 10 may be configured to remove, for example, a heat flux of power electronics device of 1000 W/cm² over a device size of 0.5 cm² to 3 cm².

The example PAC cooler assembly 10 may include a cold plate 12, a fluid wicking structure 14, a manifold case 16, and a base wick 17. The manifold case 16 may act as a cover to enclose portions of the cold plate 12, the fluid wicking structure 14, and the base wick 17, as discussed in greater detail herein.

The cold plate 12 may be a substrate that has a manifold receiving surface 50a and an opposite device receiving surface 50b. The manifold receiving surface 50a may be in contact with, or abut, the manifold case 16. That is, the manifold receiving surface 50a may be planar and provide a mounting or coupling surface for the manifold case 16 to rest on, abut, bond onto, and the like, as discussed in greater detail herein.

Still referring to FIGS. 1-3 and 4A-4B, the base wick 17 may include be a porous structure that includes an upper surface 46a, an opposite lower surface 46b, a pair of end walls 46c, and a pair of sidewalls 46d that define a thickness. A plurality of pores 18 may extend through the upper surface 46a, the lower surface 46b, the pair of end walls 46c, and/or the pair of sidewalls 46d such that liquid coolant and/or other fluids may enter, pass through and, in some embodiments, make contact with, or be fluidly coupled to the manifold receiving surface 50a of the cold plate 12. The lower surface 46b of the base wick 17 may be positioned at or extend from the manifold receiving surface 50a of the cold plate 12 in the vertical direction (i.e., in the +/–Z direction).

In some embodiments, the base wick 17 is dimensional sized to match, or be equal to the size of the heat-generating device 11 coupled to the device receiving surface 50b. In the depicted embodiments, the base wick 17 is generally depicted in a rectangular shape. This is non-limiting and the base wick 17 may be any shape, including, without limitation, square, hexagonal, octagonal, circular, triangular, and/or the like. As such, the base wick 17 may be any shape, size, and/or dimension.

Further, in non-limiting examples, the base wick 17 may be formed by a sintered copper (Cu) particle wick, a copper inverse opal wick, a wick formed by sintering stacked meshes, a wick that is laser patterned in Cu or a ceramic, a Cu wick that includes simple capillary grooves in a base material, and the like.

Further, as illustrated in the depicted embodiments, the base wick 17 may extend in longitudinal direction (i.e., in the +/–X direction) a same length as the fluid wicking structure 14, and extend a distance in the lateral direction (i.e., in the +/–Y direction) less than the distance the fluid wicking structure 14 extends in the lateral direction (i.e., in the +/–Y direction), as discussed in greater detail herein. Such an arrangement provides for vapor outlets with respect to the fluid wicking structure 14 such that when the fluid makes contact with, or in close proximately to the cold plate 12 now heated at the heat-generating device 11, the vapor created or generated as part of the cooling process, may be expelled, as discussed in greater detail herein. It should be appreciated that the size of the base wick 17 is non-limiting, and the base wick 17 may extend beyond the fluid wicking structure 14 in either or both the longitudinal direction (i.e., in the +/–X direction) and the lateral direction (i.e., in the +/–Y direction).

In some embodiments, the base wick 17 is a monolithic single structure formed with the cold plate 12 to be fluidly coupled to the manifold receiving surface 50*a* at or near the heat-generating device 11. The base wick 17 may be positioned to extend from the manifold receiving surface 50*a* in the vertical direction (i.e., in the +/−Z direction). In other embodiments, the base wick 17 is separate from the cold plate 12 and is fluidly coupled to the manifold receiving surface 50*a* of the cold plate 12. In this embodiment, the base wick 17 may include a thermally conductive bond and may include a DBC (direct bonded copper) substrate, solder, or some other high temperature substrate, bonding material, or method to couple the base wick 17 to the manifold receiving surface 50*a* of the cold plate 12.

It should be appreciated that the cold plate 12 may be formed by etching a silicon wafer or by micromachining a Cu substrate. As such, in some embodiments, the cold plate 12 may be a silicon material. In other embodiments, the cold plate 12 may be Cu, AlSiC, or other materials. Further, a thickness of the cold plate 12 may depend on the intended use of the example PAC cooler assembly 10. That is, the thickness may vary depending on whether the heat-generating device 11 (FIG. 3) is an integrated circuit CPU/GPU or a power electronic semiconductor. As such, the illustrated embodiments and present disclosure are non-limiting as the thickness of the cold plate 12 varies.

Figure 3:
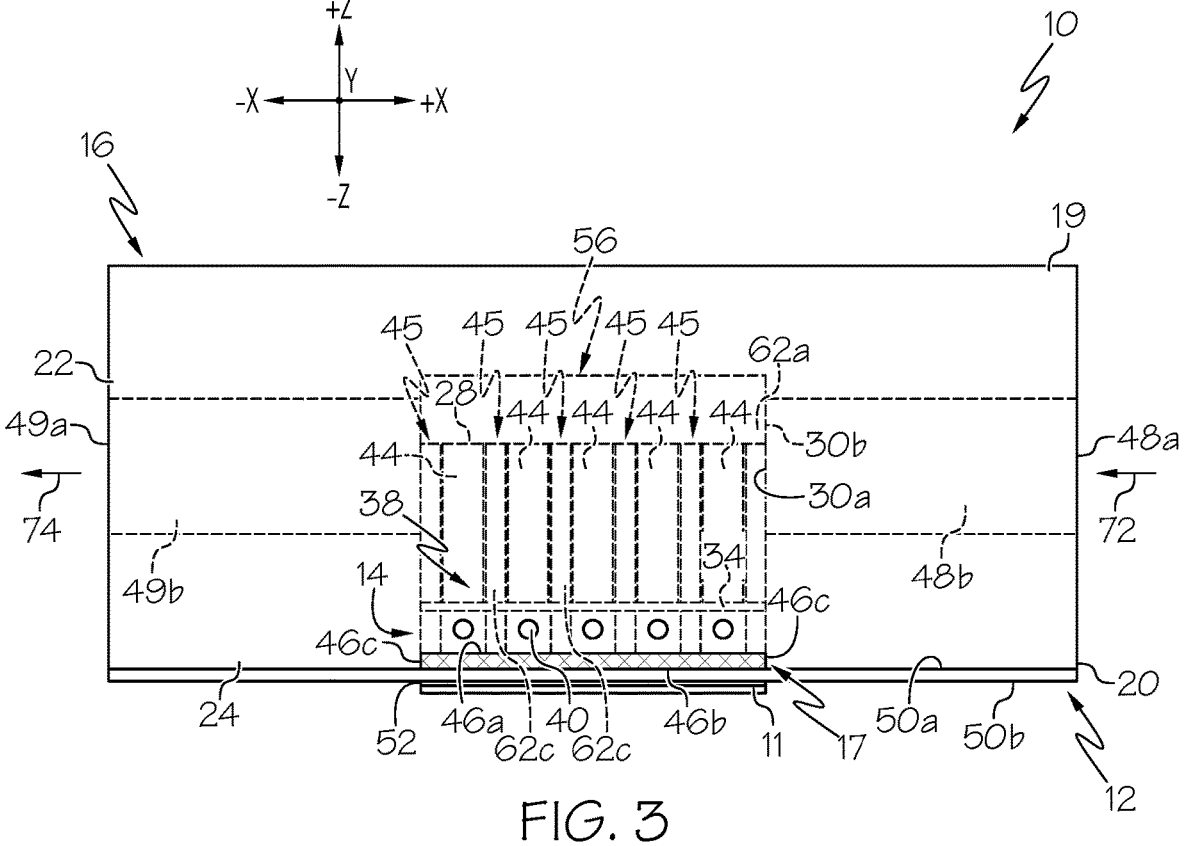
FIG. 3 schematically depicts a side view of the example PAC cooler assembly of FIG. 1 according to one or more embodiments shown or described herein.
Figure 4A:
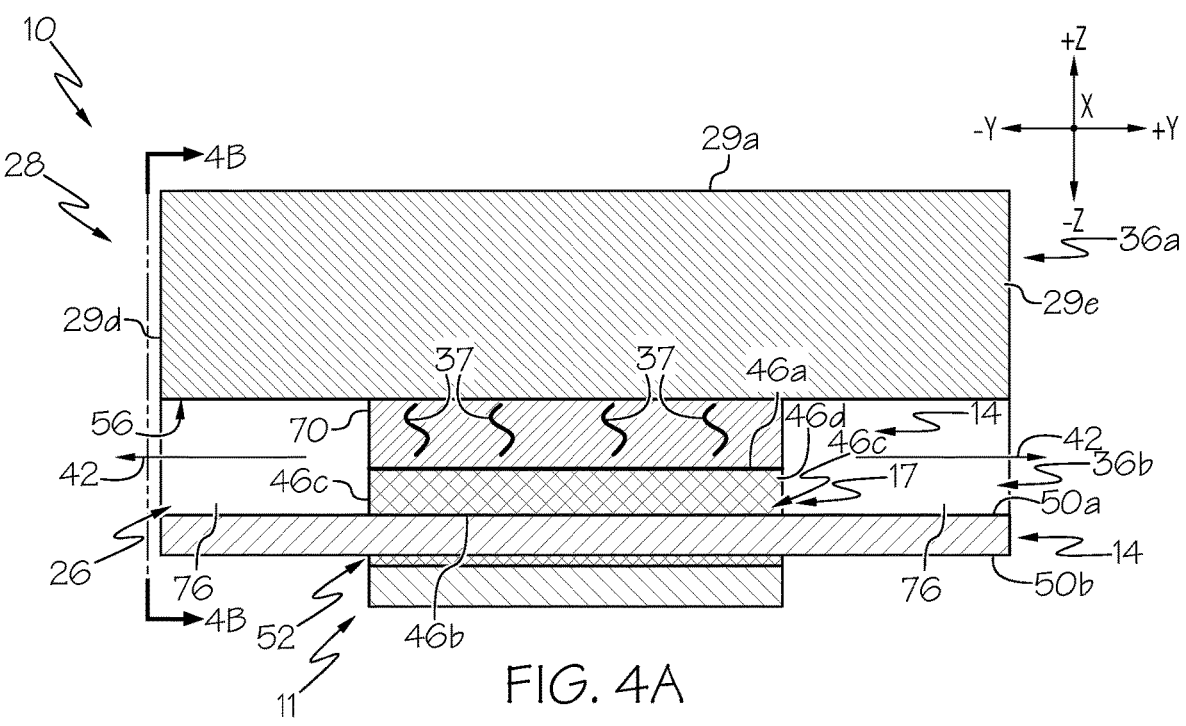
FIG. 4A schematically depicts a cross-sectional view taken from line 4A-4A of the example PAC cooler assembly of FIG. 1 according to one or more embodiments shown or described herein.
Figure 4B:
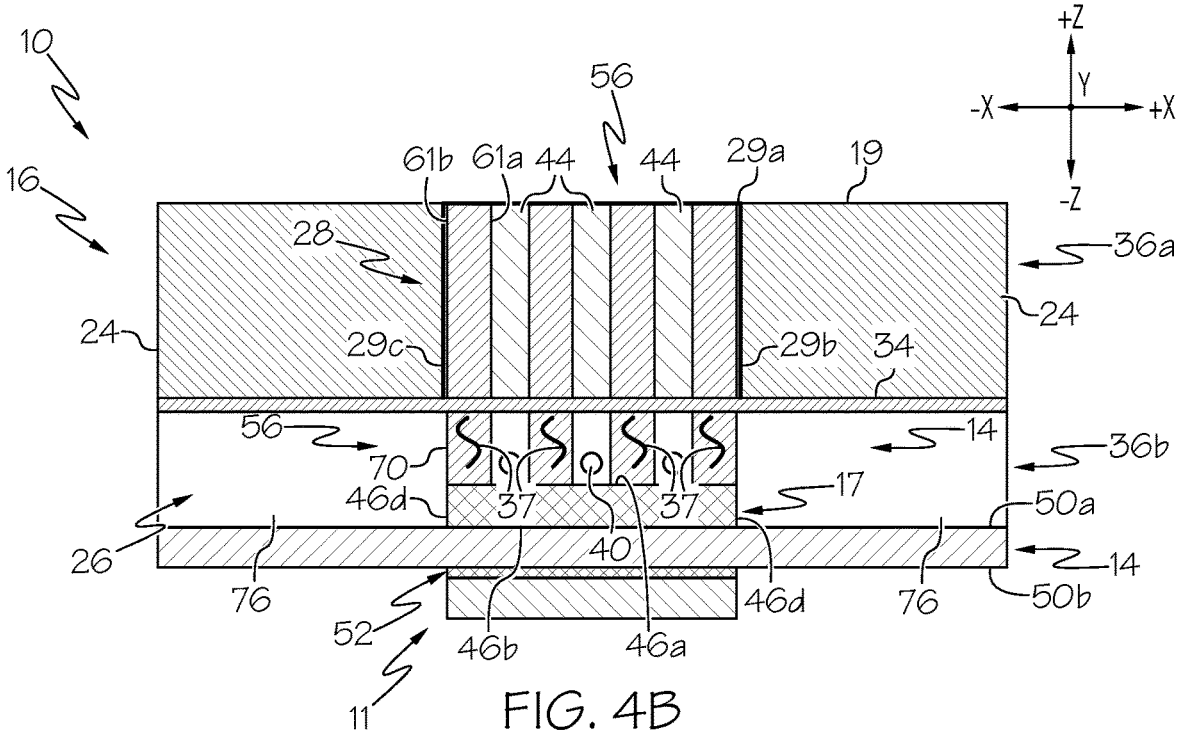
FIG. 4B schematically depicts a cross-sectional view taken from line 4B-4B of the example PAC cooler assembly of FIG. 4A according to one or more embodiments shown or described herein FIG. 5A schematically depicts a front view of a first aspect of a mesh layer of the example PAC cooler assembly of FIG. 1 according to one or more embodiments shown or described herein.

Referring now to FIGS. 3 and 4A-4B, in some embodiments, the heat-generating device 11 may be coupled to or otherwise attached to portions of the device receiving surface 50*b*. That is, in some embodiments, the heat-generating device 11 may be bonded to portions of the device receiving surface 50*b* of the cold plate 12 via a thermal interface layer 52. The thermal interface layer 52 may include a thermally conductive bond and may include a DBC (direct bonded copper) substrate, solder, or some other high temperature substrate, bonding material, or method. In other embodiments, the thermal interface layer 52 may be a thermal grease positioned between the device receiving surface 50*b* of the cold plate 12 and heat-generating device 11.

The heat-generating device 11 may be a central processing unit (CPU) or a graphics-processing unit (GPU) that use integrated circuits and are commonly found and associated with data centers. Further, the heat-generating device 11 may be a power device that may include one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the heat-generating device 11 may include a wide-bandgap semiconductor, and may be formed from any suitable material such as, but not limited to, silicon carbide (SiC), silicon dioxide (SiO2), aluminum nitride (AlN), gallium nitride (GaN), and boron nitride (BN), and the like. In some embodiments, the heat-generating device 11 may include ultra-wide-bandgap devices formed from suitable materials such as AlGaN/AlN, Ga2O3, and diamond. In some embodiments, the heat-generating device 11 may operate within a power module having a high current and/or a high power and under high temperatures (for example, in excess of 100° C., 150° C., 175° C., 200° C., 225° C., or 250° C.) and dissipate a large amount of power in the form of heat that must be removed for the continued operation of the heat-generating device 11.

Accordingly, the heat-generating device 11 may be suitable in vehicle power electronics, in data center applications with integrated circuits, and the like. The heat generated by the heat-generating device 11 may be conducted away via the PAC cooler assembly 10 to cool the heat-generating device 11. Further, the heat-generating device 11 may be any shape or size. As such, the base wick 17 may be sized and shaped to generally match the shape of the heat-generating device 11.

Now referring to back to FIGS. 1-3 and 4A-4B, the manifold case 16, as depicted, includes a top wall 19 (also referred to herein as the top surface). Further, the manifold case 16, as depicted, includes a first wall 20 (also referred to herein as the front surface) and an opposite second wall 22 (also referred to herein as the back surface), and a pair of sidewalls 24 positioned to extend between the first wall 20 and the second wall 22. Each of the first wall 20, the second wall 22, and the pair of sidewalls 24 extend from the top wall 19 in the vertical direction (i.e., in the +/−Z direction) to form a cavity 26 there between.

The manifold case 16 is configured to cover, or enclose, the fluid wicking structure 14, the base wick 17, and at least portions of the cold plate 12, as discussed in greater detail herein. In particular, the manifold case 16 further includes a receiving portion 28 that is preformed or predefined to be sized and shaped to dimensionally to receive the fluid wicking structure 14 when the manifold case 16 is positioned to abut the cold plate 12, as best illustrated in FIGS. 1-3 and 4A-4B.

The receiving portion 28 may include an upper wall 29*a*, an inlet wall 29*b*, an opposite outlet wall 29*c* and a pair of retaining sidewalls 29*d*, 29*e* positioned to extend between the upper wall 29*a*, the inlet wall 29*b*, and the outlet wall 29*c*. Each of the upper wall 29*a*, the inlet wall 29*b*, the outlet wall 29*c*, and the pair of retaining sidewalls 29*d*, 29*e* have an inner surface 30*a* and extend from the upper wall 29*a* in the vertical direction (i.e., in the +/−Z direction) to form a cavity 32 there between defined by the inner surface 30*a*. Further, the receiving portion 28 includes an opposite outer surface 30*b* that is positioned within the cavity 26 of the manifold case 16. The receiving portion 28 is dimensionally shaped to receive the fluid wicking structure 14 when the manifold case 16 is positioned to abut the cold plate 12, as best illustrated in FIGS. 1 and 4A-4B.

In embodiments, a partition wall 34 extends from the inner surface 30*a* circumferentially within the cavity 32 to form or define a fluid bypass portion 36*a* from a vapor space portion 36*b*, as discussed in greater detail herein. The fluid bypass portion 36*a* is positioned above the partition wall 34 in the vertical direction (i.e., in the +/−Z direction) while the vapor space portion 36*b* is positioned below the partition wall 34 in the vertical direction (i.e., in the +/−Z direction) In the depicted embodiments, a plurality of vapor chambers 38 extend from the retaining sidewall 29*d* through the inner and outer surfaces 30*a*, 30*b*, below the partition wall 34 (i.e., in the +/−Z direction) and from the vapor space portion 36*b* to be fluidly coupled to the vapor space portion 36*b*.

In the depicted embodiments, each of the plurality of vapor chambers 38 may be hexahedral in shape with a bore 40 and extend from the retaining sidewall 29*d* through the sidewall 24 of the manifold case 16 such that there may be access to the bore 40 external to the manifold case 16. That is, the bore 40 of each of the plurality of vapor chambers 38 may extend from the vapor space portion 36*b* of the receiving portion 28 and through the sidewall 24 of the manifold case 16 such that a vapor (depicted by the arrow 42 in FIG. 4A) generated or created in the vapor space portion 36*b* may exit the manifold case 16, as discussed in greater detail herein. As such, a fluid path exists from the vapor space portion 36*b* of the receiving portion 28 and through the sidewall 24 of the manifold case 16 via the bore 40 of each of the plurality of vapor chambers 38. It should be understood that the vapor chambers 38 may be any shape such as, without limitation, cylindrical, hexagonal, octagonal, square, rectangular, any irregular or regular shape, and the like.

In embodiments, a plurality of spaced apart protrusion walls 44 extend from the inner surface 30a each of the pair of retaining sidewalls 29d, 29e. In the depicted embodiments, each of the plurality of spaced apart protrusion walls 44 may extend a same height or distance as each of the pair of retaining sidewalls 29d, 29e in the vertical direction (i.e., in the +/−Z direction). This is non-limiting and each or all of the plurality of spaced apart protrusion walls 44 may extend any height or distance and does not need to extend the same height or distance as the pair of retaining sidewalls 29d, 29e (i.e., in the +/−Z direction). Further, in the depicted embodiments, each of the plurality of spaced apart protrusion walls 44 may extend from the inner surface 30a a uniform distance in the longitudinal direction (i.e., in the +/−X direction). This is non-limiting and each or all of the plurality of spaced apart protrusion walls 44 may extend from the inner surface 30a different distances in the longitudinal direction (i.e., in the +/−X direction).

Further, in the depicted embodiments, each of the plurality of spaced apart protrusion walls 44 may be spaced apart a uniform distance in the lateral direction (i.e., in the +/−Y direction) to define a gap 45 therebetween each of the plurality of spaced apart protrusion walls 44 (e.g., a plurality of gaps dependent on the number of plurality of spaced apart protrusion walls 44). Each of the gaps 45 are spaced apart a distance $D_1$. The spacing or distance $D_1$ of the gap 45 corresponds to a thickness $T_1$ of each of a plurality of mesh layers 56 of the fluid wicking structure 14, as discussed in greater detail herein. As such, the gap 45 between corresponding protrusions of each of the plurality of spaced apart protrusion walls 44 is configured to receive at least a portion of a corresponding mesh layer of the plurality of mesh layers 56 to retain a predetermined spacing between each of the plurality of mesh layers 56, depicted by arrow $S_1$. That is, the length of each of the plurality of spaced apart protrusion walls 44 in the longitudinal direction (i.e., in the +/−X direction), depicted best in FIG. 2 by arrow $D_2$ is predetermined to maintain the predetermined spacing $S_1$ between each of the plurality of mesh layers 56, which may be generally equal to the length $D_2$ of each of the plurality of spaced apart protrusion walls 44 in the longitudinal direction (i.e., in the +/−X direction). As such, the spacing of each of the plurality of mesh layers 56 defined by the gap 45 may be predetermined to optimize fluid wicking requirements, fluid bypass requirements, and/or vapor expelling, which may be dependent on the size and shape of the plurality of mesh layers 56, as discussed in greater detail herein.

In some embodiments, each or all of the plurality of spaced apart protrusion walls 44 may include chamfered edges to assist in placement of or receiving the fluid wicking structure 14 within the receiving portion 28 of the manifold case 16 when the manifold case 16 is positioned to abut the cold plate 12, as best illustrated in FIGS. 1 and 4A-4B. In other embodiments, each or all of the plurality of spaced apart protrusion walls 44 may have edges that are any shape including squared, rounded, jagged, regular or irregular, and/or the like.

In embodiments, the plurality of vapor chambers 38 may be positioned below each of the plurality of spaced apart protrusion walls 44 in the vertical direction (i.e., in the +/−Z direction) so to be in fluid communication with each gap 45 and each of the plurality of mesh layers 56 positioned within and extending between corresponding gaps, as discussed in greater detail herein. As such, each of the plurality of vapor chambers 38 are arranged to optimally remove vapor from the receiving portion 28 and the manifold case 16, as discussed in greater detail herein.

Figure 2:
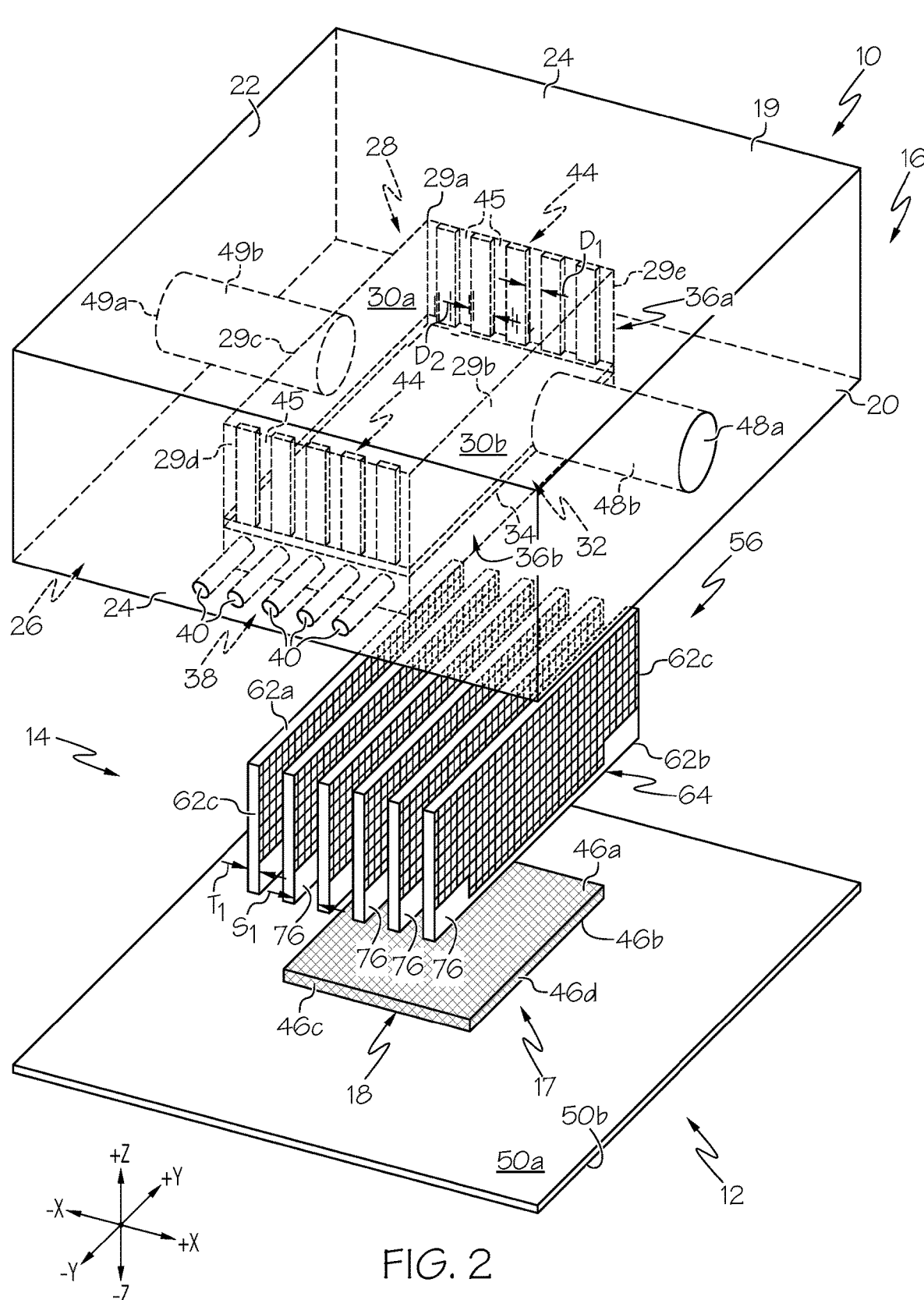
FIG. 2 schematically depicts a perspective exploded view of the example PAC cooler assembly of FIG. 1 according to one or more embodiments shown or described herein.

Still referring to FIGS. 1-3, the manifold case 16 may further include a fluid inlet 48a and a fluid outlet 49a. The fluid inlet 48a may be configured to receive a fluid, such as a liquid coolant, as depicted by the arrow labeled 72 in FIG. 3. Non-limiting example liquid coolants include dielectric cooling fluids such as deionized water, R-245fa, and HFE-7100. Other dielectric cooling fluids may be utilized. The type of dielectric cooling fluid chosen may depend on the operating temperature of the heat generating devices to be cooled.

The fluid inlet 48a is fluidly coupled to the receiving portion 28 of the manifold case 16 via an inlet conduit 48b. That is, the inlet conduit 48b may extend between the first wall 20 and the inlet wall 29b to fluidly couple the cavity 32 to the outside or external of the manifold case 16 via the fluid inlet 48a, which is open or configured to receive the fluid external to the manifold case 16. As such, in some embodiments, the liquid coolant 72 may travel within the inlet conduit 48b from the fluid inlet 48a and into the cavity 32, as discussed in greater detail herein.

The fluid outlet 49a is configured to receive the liquid coolant 72 from the receiving portion 28 and/or the fluid wicking structure 14 via an outlet conduit 49b that extends from the receiving portion 28 and/or the fluid wicking structure 14. That is, the outlet conduit 49b may extend between the second wall 22 and the outlet wall 29c to fluidly couple the cavity 32 to the outside or external of the manifold case 16 via the fluid outlet 49a, which is open or configured to dispel or remove the fluid externally from the manifold case 16. As such, the outlet conduit 49b is in fluid communication with the fluid outlet 49a such that the liquid coolant 72, now heated, is expelled from the manifold case 16 via the fluid outlet 49a, as depicted by the arrow labeled 74 in FIG. 3. The flow of the liquid coolant 72 between being delivered to the receiving portion 28 and being dispensed from the receiving portion 28 will be described in more detail herein.

Each of the fluid inlet 48a and the fluid outlet 49a are in fluid communication with the fluid bypass portion 36a of the cavity 32 of the receiving portion 28. That is, each of the fluid inlet 48a and the fluid outlet 49a fluidly couple components positioned external to the manifold case 16 (e.g., pumps, reservoirs, and the like) with the fluid bypass portion 36a of the cavity 32 of the receiving portion 28 such that the fluid may be wicked through the fluid wicking structure 14 and the vapor (depicted by the arrow 42 in FIG. 4A) may be expelled through the vapor space portion 36b via the plurality of vapor chambers 38, as discussed in greater detail herein. As such, the plurality of vapor chambers 38 may be positioned below both the fluid inlet 48a and the fluid outlet 49a in the vertical direction (i.e., in the +/−Z direction). That is, the plurality of vapor chambers 38 may be positioned closer in proximity to the cold plate 12 than the fluid inlet 48a and the fluid outlet 49a. As such, the plurality of vapor chambers 38 may be fluidly isolated from the fluid inlet 48a, the fluid outlet 49a, and the cold plate 12, and vice versa.

Further, in this embodiment, the vapor (depicted by the arrow 42 in FIG. 4A) may travel to exit the manifold case 16 in at least one direction that is traverse to the direction of the liquid coolant 72 entering the manifold case 16 via the fluid inlet 48a, as depicted in FIG. 3. As such, the vapor (depicted by the arrow 42 in FIG. 4A) exiting the fluid wicking structure 14 may follow the bore 40 of the plurality of vapor chambers 38 to exit the manifold case 16.

The manifold case 16 may be made of non-conductive material such as a plastic, a ceramic, or a composite material and may be formed via traditional methods such as injection molding, and/or may be formed via additively manufacturing methods. As used herein, the terms "additively manufactured" or "additive manufacturing techniques or processes" refer generally to manufacturing processes wherein successive layers of material(s) are provided on each other to "build-up," layer-by-layer, a three-dimensional component. The successive layers generally fuse together to form a monolithic component which may have a variety of integral sub-components. Although additive manufacturing technology is described herein as enabling fabrication of complex objects by building objects point-by-point, layer-by-layer, typically in a vertical direction, other methods of fabrication are possible and within the scope of the present subject matter. For example, although the discussion herein refers to the addition of material to form successive layers, one skilled in the art will appreciate that the methods and structures disclosed herein may be practiced with any additive manufacturing technique or manufacturing technology. For example, embodiments of the present invention may use layer-additive processes, layer-subtractive processes, or hybrid processes.

Suitable additive manufacturing techniques in accordance with the present disclosure may include, for example and without limitation, Fused Deposition Modeling (FDM), Selective Laser Sintering (SLS), 3D printing such as by inkjets and laserjets, Sterolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Selective Laser Melting (DSLM), Selective Laser Melting (SLM), Direct Metal Laser Melting (DMLM), and other known processes.

The additive manufacturing processes described herein may be used for forming components using any suitable material. For example, the material may be plastic, metal, concrete, ceramic, polymer, epoxy, photopolymer resin, or any other suitable material that may be in solid, liquid, powder, sheet material, wire, or any other suitable form. More specifically, according to exemplary embodiments of the present subject matter, the additively manufactured components described herein may be formed in part, in whole, or in some combination of materials including but not limited to pure metals, nickel alloys, chrome alloys, titanium, titanium alloys, magnesium, magnesium alloys, aluminum, aluminum alloys, and nickel or cobalt base superalloys (e.g., those available under the name Inconel® available from Special Metals Corporation). These materials are examples of materials suitable for use in the additive manufacturing processes described herein, and may be generally referred to as "additive materials."

In addition, one skilled in the art will appreciate that a variety of materials and methods for bonding those materials may be used and are contemplated as within the scope of the present disclosure. As used herein, references to "fusing" may refer to any suitable process for creating a bonded layer of any of the above materials. For example, if an object is made from polymer, fusing may refer to creating a thermoset bond between polymer materials. If the object is epoxy, the bond may be formed by a crosslinking process. If the material is ceramic, the bond may be formed by a sintering process. If the material is powdered metal, the bond may be formed by a melting or sintering process. One skilled in the art will appreciate that other methods of fusing materials to make a component by additive manufacturing are possible, and the presently disclosed subject matter may be practiced with those methods.

In addition, the additive manufacturing process disclosed herein allows a single component to be formed from multiple materials. Thus, the components described herein may be formed from any suitable mixtures of the above materials. For example, a component may include multiple layers, segments, or parts that are formed using different materials, processes, and/or on different additive manufacturing machines. In this manner, components may be constructed which have different materials and material properties for meeting the demands of any particular application. In addition, although the components described herein are constructed entirely by additive manufacturing processes, it should be appreciated that in alternate embodiments, all or a portion of these components may be formed via casting, machining, and/or any other suitable manufacturing process. Indeed, any suitable combination of materials and manufacturing methods may be used to form these components.

An exemplary additive manufacturing process will now be described. Additive manufacturing processes fabricate components using three-dimensional (3D) information, for example a three-dimensional computer model, of the component. Accordingly, a three-dimensional design model of the component may be defined prior to manufacturing. In this regard, a model or prototype of the component may be scanned to determine the three-dimensional information of the component. As another example, a model of the component may be constructed using a suitable computer aided design (CAD) program to define the three-dimensional design model of the component.

The design model may include 3D numeric coordinates of the entire configuration of the component including both external and internal surfaces of the component. For example, the design model may define the body, the surface, and/or internal passageways such as openings, support structures, and the like. In one exemplary embodiment, the three-dimensional design model is converted into a plurality of slices or segments, e.g., along a central (e.g., vertical) axis of the component or any other suitable axis. Each slice may define a thin cross section of the component for a predetermined height of the slice. The plurality of successive cross-sectional slices together form the 3D component. The component is then "built-up" slice-by-slice, or layer-by-layer, until finished.

In this manner, the components described herein may be fabricated using the additive process, or more specifically each layer is successively formed, e.g., by fusing or polymerizing a plastic using laser energy or heat or by sintering or melting metal powder. For example, a particular type of additive manufacturing process may use an energy beam, for example, an electron beam or electromagnetic radiation such as a laser beam, to sinter or melt a powder material. Any suitable laser and laser parameters may be used, including considerations with respect to power, laser beam spot size, and scanning velocity. The build material may be formed by any suitable powder or material selected for enhanced strength, durability, and useful life, particularly at high temperatures.

As such, it should be understood that any or all of the components of the example PAC cooler assembly 10 may be formed using additively manufacturing process to include, without limitation, the cold plate 12, the fluid wicking structure 14, the manifold case 16, and the base wick 17.

Still referring to FIGS. 1-3 and now to FIGS. 4A-4B, the fluid wicking structure 14 includes the plurality of mesh layers 56 that are each spaced apart from one another. In a non-limiting example, the plurality of mesh layers 56 are spaced apart in the longitudinal direction (e.g., in the +/−X direction). The spacing of each of the plurality of mesh layers 56 is established, or maintained, by the plurality of spaced apart protrusion walls 44, as discussed in greater detail herein.

Each of the plurality of mesh layers 56 are defined or formed by an upper frame 62a and an opposite lower frame 62b and a pair of side frames 62c that connects the upper frame 62a to the lower frame 62b to form a rectangular mesh layer that has the thickness T1. As best depicted in FIGS. 1-3, the plurality of mesh layers 56 are positioned or stacked in the longitudinal direction (i.e., in the +/−X direction) and spaced apart at a predetermined space or gap, depicted by arrow $S_1$ in FIG. 2, such that, in a non-limiting example, there is a 600 micron gap between the next mesh layer. It should be understood that this is non-limiting and that the gap between each of the plurality of mesh layers 56 may be greater than or less than or greater than 600 microns.

That is, the pair of side frames 62c for each of the plurality of mesh layers 56 are received within the gaps 45 that corresponds to one another to space each the of the plurality of mesh layers 56 a predetermined distance or in a predetermined spaced apart arrangement. As such, in a non-limiting example, each of the gaps 45 may be sized to receive the pair of side frames 62c and spaced apart to define the 600-micron gap between the next mesh layer. As mentioned above, this is non-limiting and the gap or space between each of the plurality of mesh layers 56 may be greater than or less than or greater than 600 microns. In some embodiments, the pair of side frames 62c for each of the plurality of mesh layers 56 received within the corresponding gaps 45 is in a snap fit configuration. In other embodiments, the pair of side frames 62c for each of the plurality of mesh layers 56 received within the corresponding gaps 45 may be by press fit, or other suitable methods appreciated by those skilled in the art.

A plurality of mesh pores 64 are positioned between the upper frame 62a and the lower frame 62b and the pair of side frames 62c to form a liquid channel. Note that the mesh layers 56 may take an alternative configuration (not shown) where the mesh pores 64 extend fully between the upper frame 62a, the lower frame 62b, and the pair of side frames 62c. The size of the opening of the plurality of mesh pores 64 may be dependent on the amount of liquid coolant 72 desired to be wicked to the base wick 17 and/or to the cold plate 12 and/or pass through to the fluid outlet 49a. In a non-limiting example, the size of the plurality of mesh pores 64 are 250 microns. It should be understood that this is non-limiting and that the size of the plurality of mesh pores 64 may be less than or greater than 250 microns.

Further, in some embodiments, the sizes of each of the plurality of mesh pores 64 may be uniform. In other embodiments, the size of each of the plurality of mesh pores 64 may be non-uniform when fabricated using the additively manufacturing processes described in greater detail herein. That is, the size of each of the plurality of mesh pores 64 may vary between mesh layers, may vary between groups of mesh layers, may vary on a single mesh layer, combinations thereof, and the like. Further, while the plurality of mesh pores 64 are depicted has having a generally square shape, this is non-limiting and each of the plurality of mesh pores may be circular, octagonal, hexagonal, rectangular, random due to particle sintering (within some specific hydraulic diameter range), combinations thereof, and/or the like.

Now referring to FIGS. 1-3 and 5A, each of the plurality of mesh layers 56 may include the plurality of mesh pores 64 that extend from and/or between the pair of side frames 62c in the lateral direction (e.g., in the +/−Y direction) and extend from the upper frame 62a towards the lower frame 62b in the vertical direction (e.g., in the +/−Z direction) to a predetermined, or imaginary line 58 defining a mesh pore portion 68 of the plurality of mesh pores 64. Only a portion of the plurality of mesh pores 64 extend below the imaginary line 58 and between the lower frame 62b and the imaginary line 58 to define a base tab portion 70. The imaginary line 58 may align with, or correspond to, the positioning of the partition wall 34. As such, the imaginary line 58 may provide for or define, with respect to the plurality of mesh layers 56, the fluid bypass portion 36a positioned above the imaginary line 58 in the vertical direction (i.e., in the +/−Z direction) and the vapor space portion 36b positioned below the imaginary line 58 in the vertical direction (i.e., in the +/−Z direction). The base tab portion 70 is positioned within the vapor space portion 36b of the receiving portion 28.

In this embodiment, the mesh pore portion 68 and the base tab portion 70 may generally define a "T" shape of the plurality of mesh pores 64. As such, in this embodiment, the plurality of mesh pores 64 of each of the plurality of mesh layers 56 may be arranged to form a generally T-shaped liquid channel between the upper frame 62a, the lower frame 62b, and the pair of side frames 62c. The base tab portion 70 may be positioned to be fluidly coupled to the base wick 17. That is, in some embodiments, the base tab portion 70 may be positioned directly above the base wick 17 in the vertical direction (i.e., in the +/−Z direction) such that the liquid coolant 72 may directly travel or wick from the base tab portion 70 to the base wick 17. It should be appreciated that the plurality of mesh pores 64, the space or gap between the mesh layers 56, and the like, may be graded (i.e., varied) to provide a customized fluid flow.

It should be understood that the plurality of mesh pores 64 of each of the mesh layers 56 together form a plurality of micro fluid delivery channels or pathways. That is, portions of the liquid coolant 72 is wicked along the plurality of mesh pores 64 toward the base wick 17 and the cold plate 12. The plurality of mesh pores 64 may also enable the liquid coolant 72 to flow laterally, vertically and/or longitudinally through the PAC cooler assembly 10. As such, each one of the plurality of mesh layers 56 may be arranged such that the fluid wicking structure 14 generates an equidistant wicking delivery path 37 across the plurality of mesh layers 56 in the lateral direction (i.e., in the +/−Y direction) and to the base wick 17 of the cold plate 12 in the vertical direction (i.e., in the +/−Z direction).

In some embodiments, the inlet conduit 48b is fluidly coupled to plurality of mesh pores 64 in the fluid bypass portion 36a of the receiving portion 28 such that as the liquid coolant 72 enters the fluid inlet 48a and through the inlet conduit 48b to direct the liquid coolant 72 into the fluid wicking structure 14. The liquid coolant 72 is then wicked, via a capillary action, through and around the plurality of mesh pores 64 of the mesh layers 56 and through the gaps between the plurality of mesh layers 56, into the base wick 17 and to the cold plate 12, as discussed in greater detail herein.

Further, on either side of the base tab portion 70 are voids 76, or areas without any of the mesh pores of the plurality of mesh pores 64. The voids 76 are configured to receive and direct the vapor (depicted by the arrow 42 in FIG. 4A) out of the vapor space portion 36*b* via the plurality of vapor chambers 38 to be expelled from the manifold case 16, as best illustrated in FIG. 4A.

Each of the mesh layers 56 may be formed with a metal material, such as copper (Cu), aluminum (Al), nickel (Ni), iron (Fe), zinc (Zn), alloys thereof, and the like. As used herein, the term "alloys thereof" refers to alloys not limited to the elements listed unless otherwise stated. For example, a Cu alloy as disclosed herein may include an alloy formed from Cu and elements other than Al, Ni, Fe, and Zn. In the alternative, a Cu alloy as disclosed herein may include an alloy formed from Cu with Al, Ni, Fe and/or Zn, plus additional elements. In another alternative, a Cu alloy as disclosed herein may include an alloy formed from only Cu and Al, Ni, Fe and/or Zn plus any incidental impurities present from manufacturing of the Cu alloy. The mesh layers 56 may also be formed of silicon, AlSiC (metal-matrix composite), or a ceramic.

Now referring to FIG. 5B, each of the plurality of mesh layers 56 may further include an opening 60 extending in the pattern of the plurality of mesh pores 64 that extends from and/or between the pair of side frames 62*c* in the lateral direction (e.g., in the $+/-Y$ direction) a length $L_1$ and extends from the upper frame 62*a* towards the lower frame 62*b* in the vertical direction (e.g., in the $+/-Z$ direction) in a height $H_1$. In the depicted embodiment, the length $L_1$ of the opening 60 is greater than the height $H_1$ to generally form a rectangular shape. This is non-limiting and the opening 60 may be any shape including, without limitation, square, hexagonal, octagonal, circular, triangular, and/or the like. The opening 60 extends between an exterior surface 61*a* and an interior surface 61*b* of the mesh layers 56.

The opening 60 in each of the plurality of mesh layers 56 may be co-axially aligned, but offset from one another in the longitudinal direction (i.e., in the $+/-X$ direction) by the spacing between each of the plurality of mesh layers 56. Each opening 60 aligns with the next, subsequent, or adjacent, opening 60 of the mesh layer 56, and so on, in the longitudinal direction (i.e., in the $+/-X$ direction). The size and/or shape of the opening 60 may be dependent on the amount of liquid coolant desired to be wicked to the cold plate 12, and/or pass through opening 60, and/or pass through to the fluid outlet 49*a*, as discussed in greater detail herein. Further, in some embodiments, the size and/or positioning of the opening 60 in each of the plurality of mesh layers 56 may be uniform. In other embodiments, the size and/or positioning of the opening 60 may be non-uniform. That is, the size and/or position of the opening 60 may vary between mesh layers 56, may vary between groups of mesh layers 56, combinations thereof, and the like. Further, the opening 60 are positioned within the fluid bypass portion 36*a* of the receiving portion 28 such that the liquid coolant 72 may enter the receiving portion 28, wick within the plurality of mesh layers 56 towards the base wick 17 and/or pass through the opening 60.

In some embodiments, the opening 60 is formed using a laser machining or low-cost stamping process to allow the liquid coolant 72 to bypass the mesh pores 64 and reduce an overall pressure drop. In some embodiments, the opening 60 may be framed or boxed in such that the plurality of mesh pores 64 do not extend into the opening 60 and the opening 60 is configured as the bypass supply cutout or bypass fluid path.

Now referring to FIG. 5C, each of the plurality of the mesh pores 64 that extend below the imaginary line 58 may include a plurality of alternating notches 66 or cutouts to form a tooth arrangement near or adjacent to the lower frame

62*b*. Each of the plurality of alternating notches 66 may extend in the lateral direction (e.g., in the $+/-Y$ direction) a length $L_2$ and a height $H_2$ in the vertical direction (e.g., in the $+/-Z$ direction). In the depicted embodiment, the length $L_2$ of the plurality of alternating notches 66 may be equal to the height $H_2$ to generally form an alternating uniform square shape. This is non-limiting and the plurality of alternating notches 66 may be any shape including, without limitation, rectangular, hexagonal, octagonal, circular, triangular, and/ or the like. The plurality of alternating notches 66 extend between the exterior surface 61*a* and the interior surface 61*b* of the mesh layers 56.

The plurality of alternating notches 66 in each of the plurality of mesh layers 56 may be co-axially aligned and offset or spaced apart from one another in the longitudinal direction (i.e., in the $+/-X$ direction) by the spacing between each of the plurality of mesh layers 56. Each of the plurality of alternating notches 66 may align with the next, subsequent, or adjacent, mesh layer 56, and so on, in the longitudinal direction (i.e., in the $+/-X$ direction). The size and/or shape of each of the plurality of alternating notches 66 may be dependent on the amount of vapor space desired between the base wick 17 and the plurality of mesh layers 56 to increase or decrease vapor (illustrated by the arrow 42 in FIG. 4A) to be removed, as discussed in greater detail herein. Further, in some embodiments, the size and/or positioning of the plurality of alternating notches 66 in each of the plurality of mesh layers 56 may be uniform. In other embodiments, the size and/or positioning of the plurality of alternating notches 66 may be non-uniform. That is, the size and/or position of the plurality of alternating notches 66 may vary between mesh layers 56, may vary between groups of mesh layers 56, combinations thereof, and the like.

As such, the plurality of alternating notches 66 may be positioned within the vapor space portion 36*b* of the receiving portion 28 and configured to assist in providing additional space between the plurality of mesh layers 56 and the cold plate 12 to remove vapor (illustrated by the arrow 42 in FIG. 4A). In some embodiments, the plurality of alternating notches 66 are formed using a laser machining or low-cost stamping process to allow for better control of the vapor by varying the vapor space.

It should be appreciated that the embodiments depicted in FIGS. 5A-5C may be combined to form mesh layers 56 that do not include the opening 60 for bypass fluid cutout or bypass fluid path, but include the plurality of alternating notches 66 for an enhanced vapor space. As such, each of the mesh layers 56 may be customized and scalable depending on the particular application, desired effect, and the like.

Figure 6:
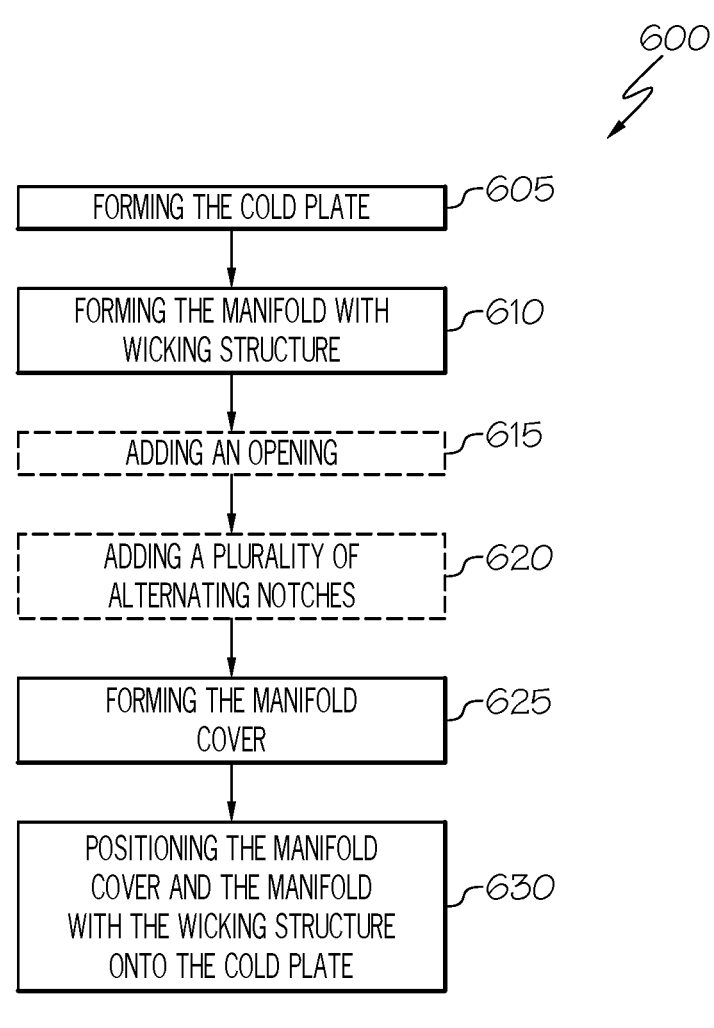
FIG. 6 depicts a flow diagram of an illustrative method for forming the example PAC cooler assembly of FIG. 1 according to one or more embodiments shown and described herein.

Referring now to FIG. 6, a flow diagram that graphically depicts an illustrative method 600 for forming the example PAC cooler assembly is provided. Although the steps associated with the blocks of FIG. 6 will be described as being separate tasks, in other embodiments, the blocks may be combined or omitted. Further, while the steps associated with the blocks of FIG. 6 will described as being performed in a particular order, in other embodiments, the steps may be performed in a different order.

At block 605, the cold plate is formed. The cold plate may be formed to include the base wick. The cold plate may be formed using etching, micromachining, and/or the like. At block 610, the fluid wicking structure is formed. The fluid wicking structure may be formed using additively manufacturing processes or may be formed using any other known techniques. The fluid wicking structure includes the plurality of mesh layers. Each of the plurality of mesh layers may include the plurality of pores to promote or direct the liquid coolant to the cold plate in an equidistant wicking delivery path.

Optionally, each of the plurality of mesh layers may further be formed with the opening, at block 615, and/or formed with the plurality of alternating notches, at block 620. Further, each of the plurality of mesh layers may be coaxially aligned and positioned to be spaced apart from one another in the longitudinal direction (e.g., in the +/−X direction).

At block 625, the manifold case is formed. The manifold case may be formed using additively manufacturing processes. For example, the manifold case may be three-dimensionally printed from a polymer around the plurality of mesh layers such that the plurality of mesh layers are positioned to extend to be fluidly coupled to the receiving portion of the manifold case. In other embodiments, the manifold case may be separately formed for the insertion of the plurality of mesh layers into the receiving cavity.

At block 630, the manifold case, the fluid wicking structure and the plurality of mesh layers are positioned to be in communication with the cold plate such that each of the plurality of mesh layers extend and fluidly couple the inlet to the manifold surface through the base wick and the array for fluid channels of the cold plate to create the equidistant wicking length across the plurality of mesh layers down to the cold plate. That is, a portion of the lower frame of each of the plurality of mesh layers may be configured to be in fluid communication with the base wick of the cold plate.

It should be understood that the example PAC cooler assembly described herein is highly scalable compared to conventional assemblies since wicking length does not change based on chip size.

The above-described PAC cooler assembly provides for thermal management of integrated circuits and/or power electronics device utilizing a cold plate, a fluid wicking structure, and an outer manifold case. A liquid coolant is wicked onto a cold plate. Further, vapor is expelled from the liquid coolant that contacts the cold plate and the liquid coolant that does not contact the cold plate is routed out of the PAC cooler assembly. Further, a fluid bypass may be used.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A pump assisted capillary cooler assembly comprising:
a cold plate having a first surface and an opposite second surface;
a base wick fluidly coupled to the first surface;
a heat-generating device coupled to the second surface of the cold plate;
a fluid wicking structure comprising:
a plurality of mesh layers, each one of the plurality of mesh layers spaced apart from one another, each of the plurality of mesh layers having a portion in fluid communication with the base wick,
wherein the plurality of mesh layers and the base wick are configured to direct a liquid coolant to the first surface of the cold plate in an equidistant wicking delivery path to the cold plate.

2. The pump assisted capillary cooler assembly of claim 1, further comprising a manifold case, the manifold case further comprises:
a fluid inlet;
a fluid outlet, wherein the fluid inlet is configured for receiving the liquid coolant into the fluid wicking structure, and the fluid outlet is configured for removing the liquid coolant from the fluid wicking structure;
a receiving portion configured to receive the fluid wicking structure; and
a plurality of vapor chambers extending from the receiving portion, wherein the plurality of vapor chambers are configured for removing a vapor from the receiving portion.

3. The pump assisted capillary cooler assembly of claim 2, wherein the receiving portion further comprises:
a partition wall extending from an inner surface to define a fluid bypass portion and a vapor space portion.

4. The pump assisted capillary cooler assembly of claim 3, wherein the fluid inlet, the fluid wicking structure, and the fluid outlet are each fluidly isolated from the plurality of vapor chambers by the partition wall.

5. The pump assisted capillary cooler assembly of claim 4, wherein a portion of the manifold case is configured to be in contact with the cold plate and to encapsulate the fluid wicking structure and the base wick.

6. The pump assisted capillary cooler assembly of claim 2, wherein the equidistant wicking delivery path is in a vertical direction between the cold plate and the fluid inlet.

7. The pump assisted capillary cooler assembly of claim 2, wherein each of the plurality of mesh layers further comprises:
an upper frame;
an opposite lower frame;
a pair of side frames extending between the upper frame and the lower frame; and
a plurality of mesh pores.

8. The pump assisted capillary cooler assembly of claim 7, wherein the receiving portion further comprises:
a plurality of spaced apart protrusion walls extending from an inner surface to define a plurality of gaps,
wherein each of the plurality of gaps are configured to receive a corresponding side frame of the plurality of mesh layers to retain each of the plurality of mesh layers in a spaced apart arrangement.

9. The pump assisted capillary cooler assembly of claim 7, wherein each of the plurality of mesh layers further comprise an opening portioned between the upper frame, the lower frame, and the pair of side frames and the opening is configured as a bypass fluid path.

10. The pump assisted capillary cooler assembly of claim 7, wherein the plurality of mesh pores further comprise a plurality of alternating notches to form a tooth arrangement adjacent to the lower frame, the plurality of alternating notches are in fluid communication with the plurality of vapor chambers extending from the receiving portion, wherein the plurality of vapor chambers are configured for removing the vapor from the receiving portion.

11. The pump assisted capillary cooler assembly of claim 1, wherein each one of the plurality of mesh layers are arranged such that the fluid wicking structure generates an equidistant wicking length across the plurality of mesh layers in a lateral direction to the first surface of the cold plate.

12. An electronics assembly comprising:
a cooler assembly comprising:

US 12,610,503 B2

17 a cold plate having a first surface and an opposite second surface;

a base wick fluidly coupled to the first surface of the cold plate;

a heat generating device coupled to the second surface of the cold plate; and a fluid wicking structure comprising:

a plurality of mesh layers, each one of the plurality of mesh layers spaced apart from one another, each of the plurality of mesh layers having a portion in fluid communication with the base wick, the plurality of mesh layers further comprising:

an upper frame;

an opposite lower frame;

a pair of side frames extending between the upper frame and the lower frame; and a plurality of mesh pores, wherein the plurality of mesh pores of the plurality of mesh layers and the base wick are configured to direct a liquid coolant to the first surface in an equidistant wicking delivery path to the cold plate, the equidistant wicking delivery path is in a vertical direction between the cold plate and the plurality of mesh layers.

13. The electronics assembly of claim 12, further comprising a manifold case, the manifold case further comprises:

a fluid inlet;

a fluid outlet, wherein the fluid inlet is configured for receiving the liquid coolant into the fluid wicking structure, and the fluid outlet is configured for removing the liquid coolant from the fluid wicking structure;

a receiving portion configured to receive the fluid wicking structure; and a plurality of vapor chambers extending from the receiving portion, wherein the plurality of vapor chambers are configured for removing a vapor from the receiving portion.

14. The electronics assembly of claim 13, wherein the receiving portion further comprises:

a partition wall extending from an inner surface to define a fluid bypass portion and a vapor space portion.

15. The electronics assembly of claim 14, wherein the fluid inlet, the fluid wicking structure, and the fluid outlet are each fluidly isolated from the plurality of vapor chambers by the partition wall.

16. The electronics assembly of claim 13, wherein the receiving portion further comprises:

a plurality of spaced apart protrusion walls extending from an inner surface to define a plurality of gaps, wherein each of the plurality of gaps are configured to receive a corresponding side frame of the plurality of mesh layers to space apart each of the plurality of mesh layers.

17. The electronics assembly of claim 13, wherein the plurality of mesh pores further comprise a plurality of alternating notches to form a tooth arrangement adjacent to the lower frame, the plurality of alternating notches are in fluid communication with the plurality of vapor chambers extending from the receiving portion, wherein the plurality of vapor chambers are configured for removing the vapor from the receiving portion.

18. The electronics assembly of claim 12, wherein each of the plurality of mesh layers further comprise an opening portioned between the upper frame, the lower frame, and the pair of side frames and the opening is configured as a bypass fluid path.

19. The electronics assembly of claim 12, wherein each one of the plurality of mesh layers are arranged such that the fluid wicking structure generates an equidistant wicking length across the plurality of mesh layers in a lateral direction to the first surface of the cold plate.

20. A method for forming a pump assisted capillary cooler assembly, the method comprising:

forming a cold plate having a first surface and a second surface and a base wick fluidly coupled to the first surface;

forming a fluid wicking structure having a plurality of mesh layers, each of the plurality of mesh layers include a plurality of mesh pores to direct a liquid coolant to the cold plate in an equidistant wicking delivery path;

forming a manifold case configured to receive the fluid wicking structure, the manifold case further configured to encapsulate the base wick and the fluid wicking structure; and positioning the manifold case, the fluid wicking structure, and the plurality of mesh layers in communication with the first surface of the cold plate such that a portion of each of the plurality of mesh layers are in fluid communication with the base wick of the cold plate.

* * * * *